United States Patent
Malhotra et al.

(10) Patent No.: US 8,476,141 B2
(45) Date of Patent: Jul. 2, 2013

(54) HIGH PERFORMANCE DIELECTRIC STACK FOR DRAM CAPACITOR

(71) Applicants: Intermolecular, Inc., San Jose, CA (US); Elpida Memory, Inc., Tokyo (JP)

(72) Inventors: Sandra Malhotra, Fort Collins, CO (US); Hanhong Chen, Milpitas, CA (US); Wim Deweerd, San Jose, CA (US); Mitsuhiro Horikawa, Higashihiroshima (JP); Kenichi Koyanagi, Higashihiroshima (JP); Hiroyuki Ode, Higashihiroshima (JP); Xiangxin Rui, Campbell, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/737,785

(22) Filed: Jan. 9, 2013

(65) Prior Publication Data
US 2013/0143384 A1 Jun. 6, 2013

Related U.S. Application Data

(62) Division of application No. 13/220,460, filed on Aug. 29, 2011.

(51) Int. Cl.
*H01L 21/20* (2006.01)
*H01L 21/31* (2006.01)

(52) U.S. Cl.
USPC .......................... 438/396; 438/783

(58) Field of Classification Search
None
See application file for complete search history.

(56) References Cited

U.S. PATENT DOCUMENTS

| | | | | |
|---|---|---|---|---|
| 5,731,220 | A * | 3/1998 | Tsu et al. | 438/782 |
| 7,723,771 | B2 * | 5/2010 | Boescke et al. | 257/310 |
| 2003/0128497 | A1 * | 7/2003 | Allen et al. | 361/306.3 |
| 2004/0141390 | A1 * | 7/2004 | Won et al. | 365/200 |
| 2007/0048953 | A1 * | 3/2007 | Gealy et al. | 438/305 |
| 2008/0173919 | A1 * | 7/2008 | Kudelka et al. | 257/306 |
| 2010/0187655 | A1 * | 7/2010 | Choi et al. | 257/532 |
| 2012/0156854 | A1 * | 6/2012 | Chen et al. | 438/393 |

\* cited by examiner

*Primary Examiner* — Scott B Geyer

(57) ABSTRACT

A method for fabricating a DRAM capacitor stack is described wherein the dielectric material is a multi-layer stack formed from a highly-doped material combined with a lightly or non-doped material. The highly-doped material remains amorphous with a crystalline content of less than 30% after an annealing step. The lightly or non-doped material becomes crystalline with a crystalline content of equal to or greater than 30% after an annealing step. The dielectric multi-layer stack maintains a high k-value while minimizing the leakage current and the EOT value.

9 Claims, 6 Drawing Sheets

HIGH PERFORMANCE DIELECTRIC STACK FOR DRAM CAPACITOR

CROSS-REFERENCE TO RELATED APPLICATIONS

This is a Divisional Application of U.S. patent application Ser. No. 13/220,460, filed on Aug. 29, 2011, which is herein incorporated by reference for all purposes.

This document relates to the subject matter of a joint research agreement between Intermolecular, Inc. and Elpida Memory, Inc.

FIELD OF THE INVENTION

The present invention generally relates to the field of dynamic random access memory (DRAM), and more particularly to methods of forming a capacitor stack for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increase as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to $SiO_2$ known as the Equivalent Oxide Thickness (EOT). A high-k material's EOT is calculated using a normalized measure of silicon dioxide ($SiO_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide ($TiO_2$) and zirconium dioxide ($ZrO_2$) are two metal oxide dielectric materials which display significant promise in terms of serving as high-k dielectric materials for implementation in DRAM capacitors. Other metal oxide high-k dielectric materials that have attracted attention include $HfO_2$, $Al_2O_3$, $Ta_2O_5$, etc.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

Therefore, there is a need to develop methods to fabricate DRAM capacitor stacks that exhibit a high capacitance due to the high k-value of the capacitor dielectric, exhibit low leakage current, and exhibit a low EOT value.

SUMMARY OF THE DISCLOSURE

In some embodiments of the present invention, a multi-layer dielectric stack is formed from a highly doped material and a lightly or non-doped material. The highly doped material will remain amorphous (<30% crystalline) after an anneal step. The lightly or non-doped material will become crystalline (≦30% crystalline) after an anneal step. In some embodiments, the multi-layer dielectric stack is formed from $ZrO_2$. In some embodiments, the highly doped $ZrO_2$ material is formed first on the bottom electrode and the lightly or non-doped $ZrO_2$ material is formed on top of the highly doped material. In some embodiments, the lightly or non-doped $ZrO_2$ material is formed first on the bottom electrode and the highly doped $ZrO_2$ material is formed on top of the lightly or non-doped material. In some embodiments, the multi-layer dielectric stack is formed from $TiO_2$. In some embodiments, the lightly or non-doped $TiO_2$ material is formed first on the bottom electrode and the highly doped $TiO_2$ material is formed on top of the lightly or non-doped material.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
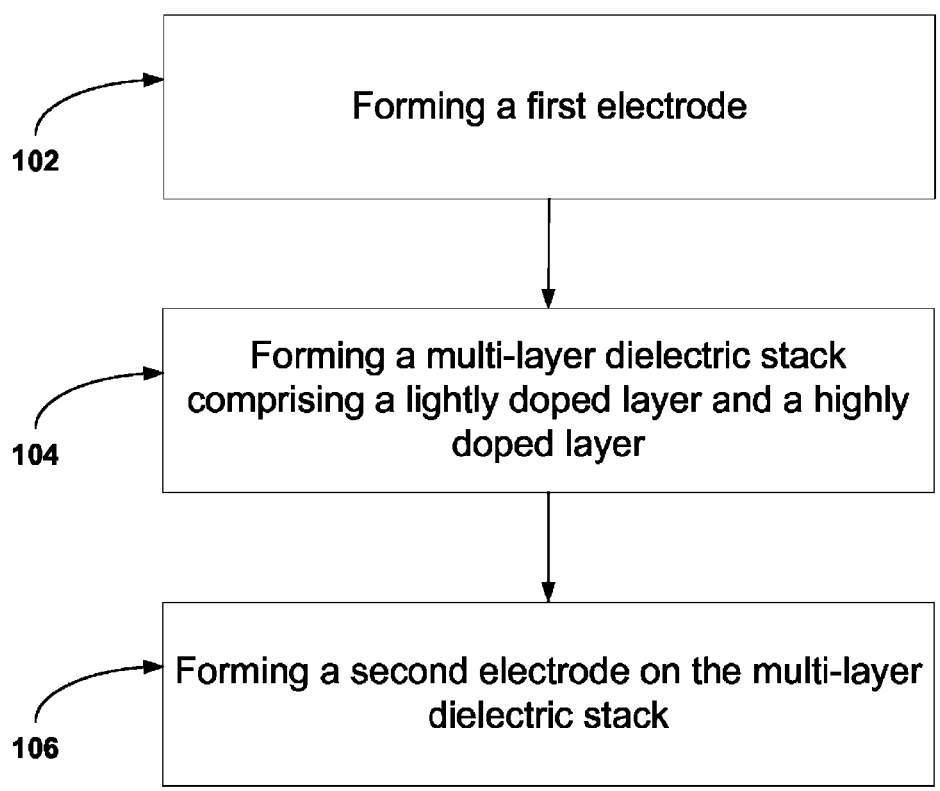
FIG. 1 is a flow chart illustrating a method for fabricating a DRAM capacitor stack in accordance with some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The dielectric constant of a dielectric material is dependent upon the crystalline phase(s) of the material. For example, in the case of $TiO_2$, the anatase crystalline phase of $TiO_2$ has a dielectric constant of approximately 40, while the rutile crystalline phase of $TiO_2$ can have a dielectric constant of approximately >80. Due to the higher-k value of the rutile-phase, it is desirable to produce $TiO_2$ based DRAM capacitors with the $TiO_2$ in the rutile-phase. Similarly, the cubic and tetragonal phases of $ZrO_2$ have a higher-k value than the monoclinic phase. So, it is desirable to produce $ZrO_2$ based DRAM capacitors with the $ZrO_2$ in the cubic or tetragonal phase.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal carbides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application. Conductive metal nitrides such as TiN, TaN, WN, etc. have attracted interest as DRAM capacitor electrodes with TiN being the most popular.

In one example of conductive metal oxides, molybdenum has several oxide phases of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$. For example, $MoO_3$ (the most oxygen-rich phase) is an insulator and has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of the desired composition and crystalline phase of the thin film. The thin films used to form the MIM DRAM capacitor stack may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD).

The crystalline phases of dielectric materials exhibit higher-k values than the amorphous phases. Therefore, there is often an optional anneal step either after the dielectric formation step (also known as a post dielectric anneal (PDA)) or an anneal step after the formation of the top electrode (also known as a post metallization anneal (PMA)) to crystallize the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and having internal docket number (IM0223_US) and is incorporated herein by reference.

Dopants can be added to the dielectric material to increase the k-value and/or decrease the leakage current. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the dielectric material. Other factors that affect the crystallinity of the dielectric material comprise annealing time, annealing temperature, film thickness, etc. Generally, as the concentration of the dopant is increased, the crystallization temperature of the dielectric material increases. As an example, $TiO_2$ dielectric materials doped with Al at a concentration of less than about 10 atomic % will crystallize when annealed at 550 C for 10 minutes. However, if the Al concentration is increased to about 15 atomic % or above, then the $TiO_2$ dielectric materials remain amorphous after being annealed at 550 C for 10 minutes. Other suitable dopants for use with $TiO_2$ dielectric materials comprise Zr, Ge, Hf, Sn, Sr, Y, Si, La, Er, Ga, Gd, Mg, Co, or combinations thereof. Dopants can also be added to $ZrO_2$ dielectric materials. Suitable dopants for use with $ZrO_2$ dielectric materials comprise Al, Ge, Hf, Sn, Sr, Y, Si, Ti, La, Er, Ga, Gd, Mg, Co, or combinations thereof.

Lightly or non-doped dielectric materials wherein the dopant concentration is low will generally be crystalline after being annealed at 550 C for 5 minutes, will exhibit high k-values, but sometimes will also exhibit higher leakage current. As used herein, a dielectric material will be considered to be crystalline if it exhibits greater than or equal to 30% crystallinity as measured by a technique such as x-ray diffraction (XRD) after an anneal step. The higher leakage current is partly due to leakage along the grain boundaries due to the Frenkel-Poole mechanism discussed earlier. Conversely, highly doped dielectric materials wherein the dopant concentration is high will generally be amorphous after being annealed at 550 C for 5 minutes, will exhibit lower k-values, but will also exhibit low leakage current. Typically, dielectric materials that are doped with dopant levels above about 10 to 15 atomic % will remain amorphous after the typical anneal steps used in the fabrication of DRAM devices. However, this will vary depending on the dielectric material, the dopant, and the details of the annealing step and is not intended to be limiting. The properties of these two types of dielectric materials may be combined to concurrently meet the EOT (a function of the k-value) and the leakage current targets for advanced DRAM technologies.

FIG. 1 describes a method, 100, for fabricating a DRAM capacitor stack. The initial step, 102, comprises forming a first electrode layer. Examples of suitable electrode materials comprise metals, conductive metal oxides, conductive metal silicides, conductive metal carbides, conductive metal nitrides, or combinations thereof. Two particularly interesting classes of materials are the conductive metal nitrides and the conductive metal oxides. The first electrode layer may receive an optional treatment (not shown). In the next step, 104, a multi-layer dielectric material is formed wherein one of the layers comprises a lightly doped material, and the other layer comprises a highly doped material. After a later annealing step (either PDA or PMA, not shown), the lightly or non-doped material will become at least partially crystallized (≦30% crystalline). These materials will also generally exhibit a higher k value, but generally exhibit higher leakage current. After the later annealing step, the highly doped material will remain substantially amorphous (<30% crystalline). The crystallinity may be determined by a technique such as XRD. These materials will also generally exhibit a lower k value, but generally exhibit lower leakage current. In the next step, 106, a second electrode layer is formed on the multi-layer dielectric material. The capacitor stack may receive an optional PMA anneal (not shown).

Figure 2:
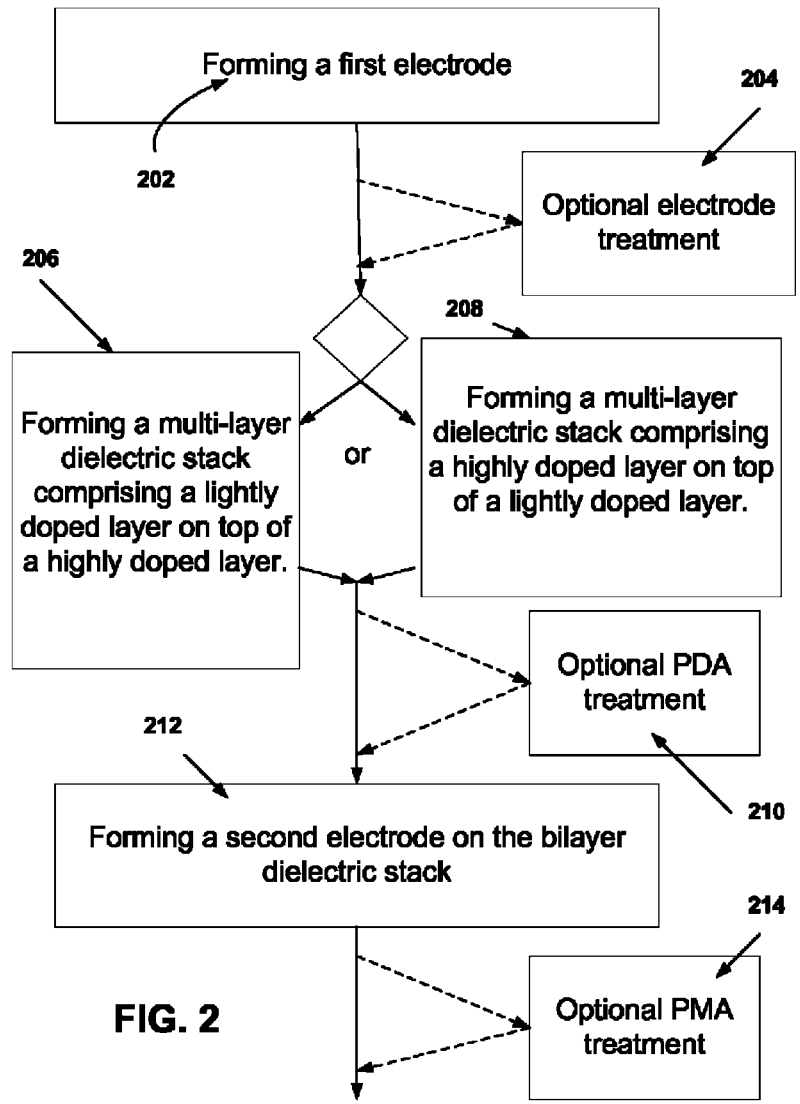
FIG. 2 is a flow chart illustrating a method for fabricating a DRAM capacitor stack in accordance with some embodiments of the present invention.

FIG. 2 illustrates a flow chart of the formation of a capacitor stack according to some embodiments of the present invention. In step 202, a first electrode layer is formed. Examples of suitable electrode materials comprise metals, conductive metal oxides, conductive metal silicides, conductive metal carbides, conductive metal nitrides, or combinations thereof. Step 204 is an optional step wherein the first electrode layer may undergo a treatment before the dielectric material is formed. If the first electrode layer is a conductive metal nitride material, then the first electrode layer may be annealed using a Rapid Thermal Anneal (RTA) technique or furnace anneal technique. For RTA case, the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, which is incorporated herein by reference. Alternatively, if the first electrode is a conductive metal oxide, then the first electrode layer may be annealed in an inert or reducing atmosphere such as Ar, $N_2$, or forming gas. Examples of such an annealing process is further described in U.S. application Ser. No. 13/084,666 filed on Apr. 12, 2011, entitled "METHOD FOR FABRICATING A DRAM CAPACITOR" and is incorporated herein by reference.

The method described in the flow chart can now take one of two possible paths. In step 206, a multi-layer dielectric material is formed wherein the first material is formed from a lightly or non-doped material. The material may be deposited with crystalline phases present or it may be deposited as an amorphous material and crystallized during a later step. A second material of the dielectric material is then formed on top of the first material. The second material is formed from a highly doped material. The second material may be the same bulk dielectric material or may be a different bulk dielectric material as the first material. In practice, the second material is advantageously the same bulk dielectric material as the first material. Additionally, the dopant used in the second material may be the same dopant or may be a different dopant as that used in the first material. In practice, the dopant used in the second material is advantageously the same as the dopant used the first material.

In step 208, an alternative method is described wherein a multi-layer dielectric material is formed wherein the first material is formed from a highly doped material. A second material of the dielectric material is then formed on top of the first material. The second material is formed from a lightly or non-doped material. The material may be deposited with crystalline phases present or it may be deposited as an amorphous material and crystallized during a later step. The second material may be the same bulk dielectric material or may be a different bulk dielectric material as the first material. In practice, the second material is advantageously the same bulk dielectric material as the first material. Additionally, the dopant used in the second material may be the same dopant or may be a different dopant as that used in the first material. In practice, the dopant used in the second material is advantageously the same as the dopant used the first material.

After the dielectric material has been formed, an optional PDA treatment may be performed as shown in step, 210 as discussed earlier and in the incorporated reference. In step, 212, a second electrode layer is formed on top of the multi-layer dielectric material. Examples of suitable electrode materials comprise metals, conductive metal oxides, conductive metal silicides, conductive metal carbides, conductive metal nitrides, or combinations thereof. After the second electrode has been formed, an optional PMA treatment may be performed as shown in step, 214 as discussed earlier and in the incorporated reference.

Figure 3:
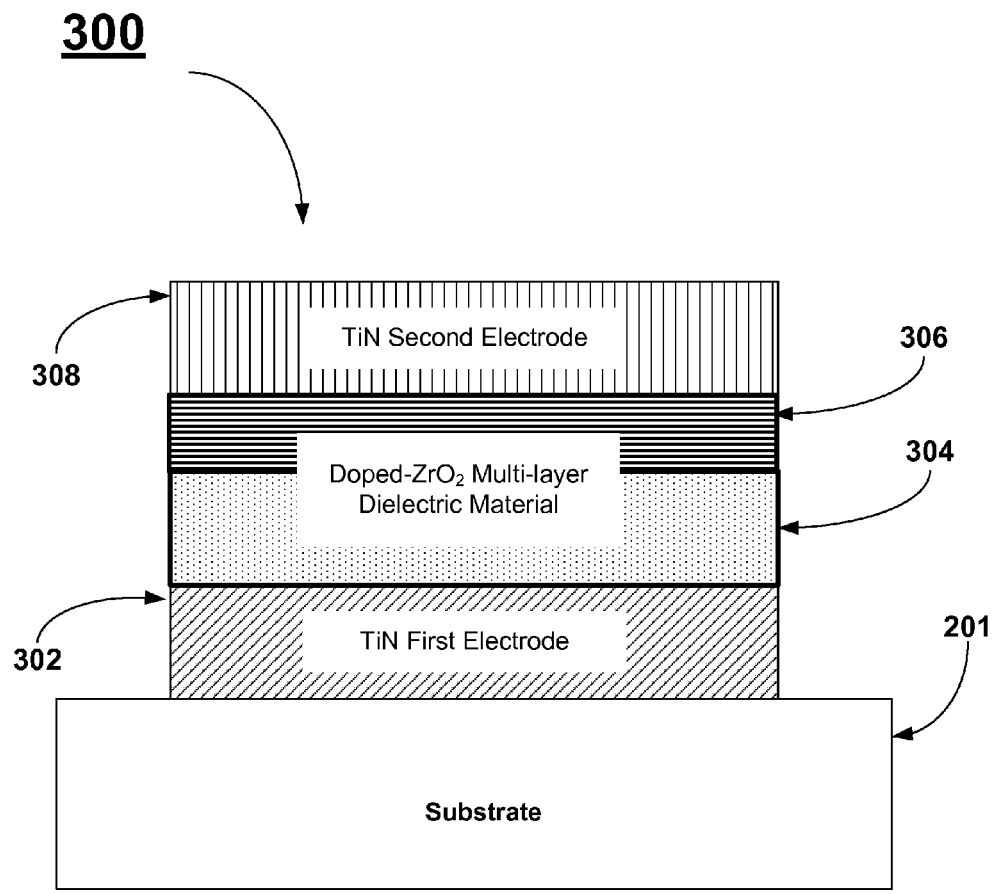
FIG. 3 illustrates a simplified cross-sectional view of a DRAM capacitor stack fabricated in accordance with some embodiments of the present invention.

FIG. 3 illustrates a simplified cross-sectional view of a DRAM capacitor stack fabricated in accordance with some embodiments of the present invention. This example will use $ZrO_2$ as the dielectric material. However, those skilled in the art will understand that the present methods may be applied to many dielectric materials. First electrode, 302, is formed on substrate, 201. When $ZrO_2$ is used as the dielectric material, the first electrode is advantageously TiN. The TiN first electrode may optionally receive a treatment before the formation of the multi-layer dielectric material as discussed previously. Lightly or non-doped $ZrO_2$ material, 304, is then formed on top of the TiN first electrode. Suitable dopants for use with $ZrO_2$ dielectric materials comprise Al, Ge, Hf, Sn, Sr, Y, Si, Ti, La, Er, Ga, Gd, Mg, Co, or combinations thereof. Highly doped $ZrO_2$ material, 306, is then formed on top of the lightly doped $ZrO_2$ material. Suitable dopants for use with $ZrO_2$ dielectric materials comprise Al, Ge, Hf, Sn, Sr, Y, Si, Ti, La, Er, Ga, Gd, Mg, Co, or combinations thereof. The multi-layer dielectric material may optionally receive a PDA treatment as discussed previously. Second electrode, 308, is then formed on top of the multi-layer dielectric material. When $ZrO_2$ is used as the dielectric material, the second electrode is advantageously TiN. The capacitor stack may optionally receive a PMA treatment as discussed previously.

Figure 4:
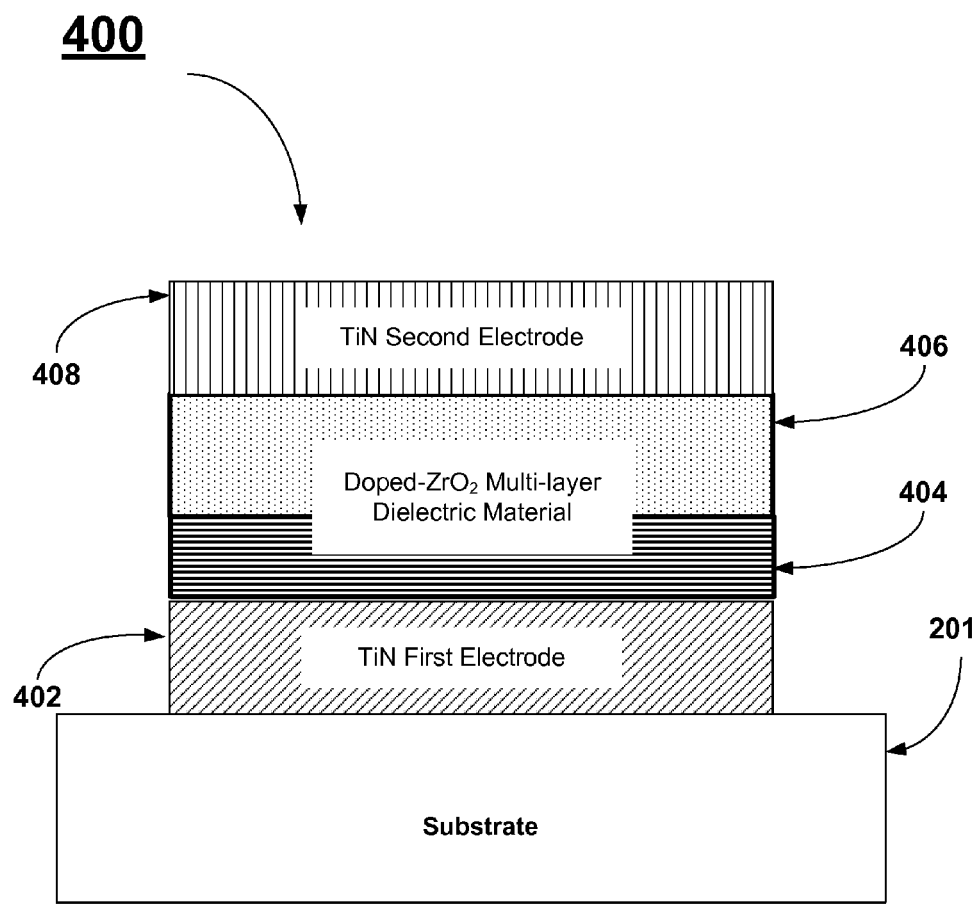
FIG. 4 illustrates a simplified cross-sectional view of a DRAM capacitor stack fabricated in accordance with some embodiments of the present invention.

FIG. 4 illustrates a simplified cross-sectional view of a DRAM capacitor stack fabricated in accordance with some embodiments of the present invention. This example will use $ZrO_2$ as the dielectric material. However, those skilled in the art will understand that the present methods may be applied to many dielectric materials. First electrode, 402, is formed on substrate, 201. When $ZrO_2$ is used as the dielectric material, the first electrode is advantageously TiN. The TiN first electrode may optionally receive a treatment before the formation of the multi-layer dielectric material as discussed previously. Highly doped $ZrO_2$ material, 404, is then formed on top of the TiN first electrode. Suitable dopants for use with $ZrO_2$ dielectric materials comprise Al, Ge, Hf, Sn, Sr, Y, Si, Ti, La, Er, Ga, Gd, Mg, Co, or combinations thereof. Lightly or non-doped $ZrO_2$ material, 406, is then formed on top of the highly doped amorphous material. Suitable dopants for use with $ZrO_2$ dielectric materials comprise Al, Ge, Hf, Sn, Sr, Y, Si, Ti, La, Er, Ga, Gd, Mg, Co, or combinations thereof. The multi-layer dielectric material may optionally receive a PDA treatment as discussed previously. Second electrode, 408, is then formed on top of the multi-layer dielectric material. When $ZrO_2$ is used as the dielectric material, the second electrode is advantageously TiN. The capacitor stack may optionally receive a PMA treatment as discussed previously.

Figure 5:
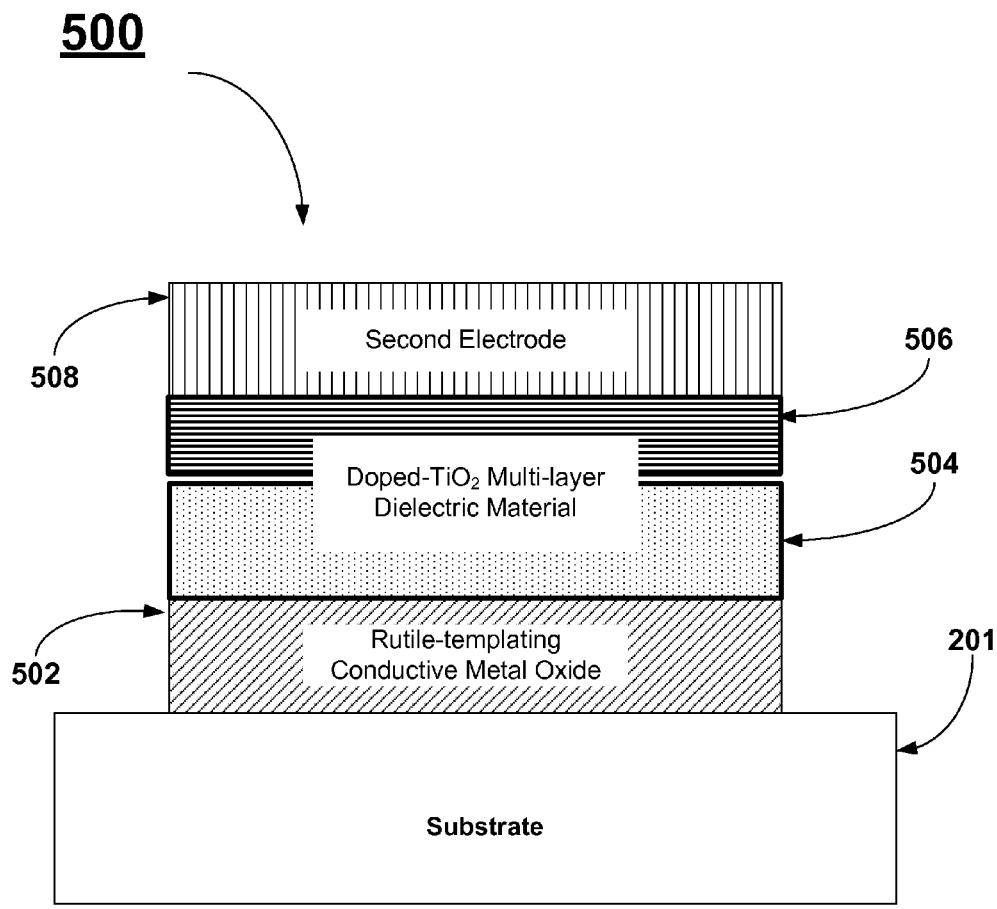
FIG. 5 illustrates a simplified cross-sectional view of a DRAM capacitor stack fabricated in accordance with some embodiments of the present invention.

FIG. 5 illustrates a simplified cross-sectional view of a DRAM capacitor stack fabricated in accordance with some embodiments of the present invention. This example will use $TiO_2$ as the dielectric material. However, those skilled in the art will understand that the present methods may be applied to many dielectric materials. First electrode, 502, is formed on substrate, 201. When $TiO_2$ is used as the dielectric material, the first electrode is advantageously a conductive metal oxide that can act as a template for the rutile phase of $TiO_2$. Advantageously, the first electrode is crystalline $MoO_2$ when the dielectric material is $TiO_2$. The $MoO_2$ first electrode may optionally receive an anneal treatment before the formation of the multi-layer dielectric material as discussed previously. Lightly doped $TiO_2$ material, 504, is then formed on top of the crystalline $MoO_2$ first electrode. Suitable dopants for use with $TiO_2$ dielectric materials comprise Al, Zr, Ge, Hf, Sn, Sr, Y, Si, La, Er, Ga, Gd, Mg, Co, or combinations thereof. When $TiO_2$ is used as the dielectric material, the lightly doped material must be on the bottom so that the high k rutile phase of $TiO_2$ is formed on the crystalline $MoO_2$ first electrode. If the highly doped material is formed on the first electrode, the multi-layer dielectric material does not exhibit a high k-value due to the absence of a large fraction of rutile phase $TiO_2$. Highly doped $TiO_2$ material, 506, is then formed on top of the lightly doped $TiO_2$ material. Suitable dopants for use with $TiO_2$ dielectric materials comprise Al, Zr, Ge, Hf, Sn, Sr, Y, Si, La, Er, Ga, Gd, Mg, Co, or combinations thereof. The multi-layer dielectric material may optionally receive a PDA treatment as discussed previously. Second electrode, 508, is then formed on top of the multi-layer dielectric material. When $TiO_2$ is used as the dielectric material, the second electrode is advantageously a metal or a conductive metal oxide. The capacitor stack may optionally receive a PMA treatment as discussed previously.

In the examples illustrated above, the multi-layer dielectric material typically is subjected to an anneal step either as a PDA treatment, a PMA treatment, or both. This anneal step crystallizes the lightly or non-doped materials to yield a material with a high k-value. This allows the physical thickness of the multi-layer dielectric material to be thick enough to suppress the leakage current from Fowler-Nordheim tunneling mechanisms as discussed previously. The high concentration of doping in the highly doped material ensures that this material remains substantially amorphous under the anneal conditions. The lack of or small existence of grain boundaries in this material suppresses the leakage current from Frenkel-Poole mechanisms as discussed previously. As the amorphous material has a lower K value than the crystalline material, the thickness of the highly doped material is held to less than 25% of the total dielectric thickness to mitigate the adverse impact on the EOT of the multi-layer dielectric stack.

Figure 6:
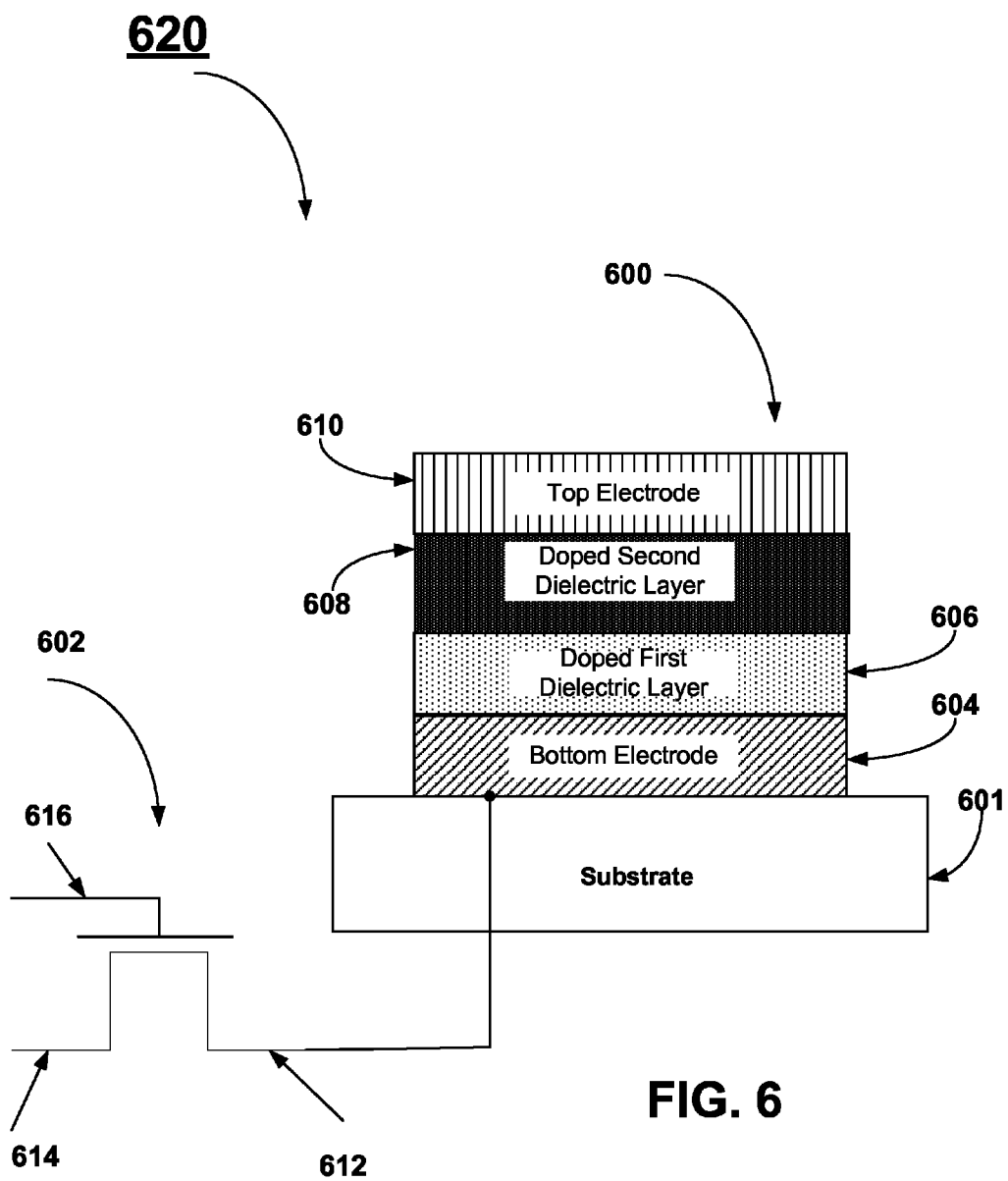
FIG. 6 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 6 is used to illustrate one DRAM cell, 620, manufactured using a bilayer dielectric structure as discussed previously. The cell, 620, is illustrated schematically to include two principle components, a cell capacitor, 600, and a cell transistor, 602. The cell transistor is usually constituted by a MOS transistor having a gate, 616, source, 612, and drain, 614. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 600, comprises a first electrode, 604, formed on substrate, 601. The first electrode, 604, is connected to the source or drain of the cell transistor, 602. For illustrative purposes, the first electrode has been connected to the source, 612, in this example. As discussed previously, first electrode, 604, may be subjected to an anneal in a reducing atmosphere before the formation of the dielectric layer if the first electrode is a conductive metal oxide such as $MoO_2$ or the first electrode may receive other treatments if the first electrode is a conductive metal nitride such as TiN. First dielectric layer, 606, is formed on top of the first electrode. As discussed previously, the first dielectric layer may be doped. If the first dielectric layer is $TiO_2$, then the first dielectric layer will be lightly or non-doped so that the rutile phase of $TiO_2$ can be formed on the bottom electrode. If the first dielectric layer is another high k material (i.e. $ZrO_2$, etc.), then the first dielectric layer may be either lightly/non-doped or highly doped. Second dielectric layer, 608, is formed on top of the first dielectric layer. As discussed previously, the second dielectric layer may be doped. If the second dielectric layer is $TiO_2$, then the second dielectric layer will be highly doped so that it will remain amorphous (<30% crystalline) after subsequent anneal steps. If the second dielectric layer is another high k material (i.e. $ZrO_2$, etc.), then the second dielectric layer may be either lightly or non-doped or highly doped. The second dielectric layer will have a different doping level than the first dielectric layer. Typically, the bilayer dielectric material is then subjected to a PDA treatment. The second electrode layer, 610, is then formed on top of the bilayer dielectric material. This completes the formation of the capacitor stack. Typically, the capacitor stack is then subjected to a PMA treatment.

One specific example of the DRAM device described above consists of a capacitor stack comprising a $MoO_2$ bottom electrode layer, a lightly or non-doped $TiO_2$ first dielectric layer, a highly doped $TiO_2$ second dielectric layer, and a second electrode layer. A second example of the DRAM device described above consists of a capacitor stack comprising a TiN bottom electrode layer, a lightly or non-doped $ZrO_2$ first dielectric layer, a highly doped $ZrO_2$ second dielectric layer, and a second electrode layer. A third example of the DRAM device described above consists of a capacitor stack comprising a TiN bottom electrode layer, a highly doped $ZrO_2$ first dielectric layer, a lightly or non-doped doped $ZrO_2$ second dielectric layer, and a second electrode layer.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
   forming a first electrode material above a substrate;
   forming a first dielectric material above the first electrode material, wherein the first dielectric material further contains a dopant;
   forming a second dielectric material above the first dielectric material, wherein the second dielectric material further contains a dopant and a doping level of the second dielectric material is less than a doping level of the first dielectric material;
   forming a second electrode material on the second dielectric material; and
   annealing the stack, wherein the first dielectric material is less than 30% crystalline after the annealing and the second dielectric material is equal to or greater than 30% crystalline after the annealing.

2. The method of claim 1 further comprising a post metallization anneal treatment after the forming of the second electrode material.

3. The method of claim 1 wherein the first electrode material is one of a metal, conductive metal oxide, conductive metal silicide, conductive metal carbides, conductive metal nitride, or combinations thereof.

4. The method of claim 1 wherein the dopant comprises one of Al, Zr, Ge, Hf, Sn, Sr, Y, Si, Ti, La, Er, Ga, Gd, Mg, Co, or combinations thereof.

5. The method of claim 1 wherein the first electrode material is TiN, the first dielectric material is doped $ZrO_2$, the second dielectric material is doped $ZrO_2$, and the second electrode material is TiN.

6. The method of claim 1 wherein the first dielectric material and the second dielectric material are formed from the same bulk dielectric material.

7. The method of claim 1 wherein the first dielectric material and the second dielectric material are formed from different bulk dielectric materials.

8. The method of claim 1 wherein the dopant in the first dielectric material and the dopant in the second dielectric material are the same.

9. The method of claim 1 wherein the dopant in the first dielectric material and the dopant in the second dielectric material are different.

* * * * *